United States Patent [19]
Golubic et al.

[11] Patent Number: 5,473,192
[45] Date of Patent: Dec. 5, 1995

[54] UNITARY SILICON DIE MODULE

[75] Inventors: Theodore R. Golubic, Phoenix; Udey Chaudhry, Mesa, both of Ariz.

[73] Assignee: Motorola, Inc., Schaumburg, Ill.

[21] Appl. No.: 55,888

[22] Filed: May 4, 1993

[51] Int. Cl.$^6$ .................................................. H01L 39/02
[52] U.S. Cl. ........................ 257/684; 257/717; 257/730
[58] Field of Search ................................. 257/684, 701, 257/730, 717, 719, 706, 735, 777

[56] References Cited

U.S. PATENT DOCUMENTS

| | | | |
|---|---|---|---|
| 4,638,552 | 1/1987 | Shimbo et al. | 29/576 J |
| 4,818,323 | 4/1989 | d'Aragona et al. | 156/286 |
| 5,010,036 | 4/1991 | Calviello et al. | 437/173 |
| 5,175,613 | 12/1992 | Barker, III et al. | 257/717 |
| 5,198,963 | 3/1993 | Gupta et al. | 257/777 |
| 5,206,713 | 4/1993 | McGeary | 257/684 |

OTHER PUBLICATIONS

Maszara, "Silicon–On–Insulator by Wafer Bonding: A Review", J. Electrochem. Soc., vol. 138, No. 1, pp. 341–347, 1991.

Primary Examiner—William Mintel
Assistant Examiner—Roy Potter
Attorney, Agent, or Firm—Miriam Jackson

[57] ABSTRACT

A semiconductor chip module is formed by providing at least one semiconductor chip and a semiconductor substrate and bonding the semiconductor chip to the semiconductor substrate without the use of an epoxy or a metallic layer to create a bond between the semiconductor chip and the semiconductor substrate. The semiconductor chip of the semiconductor chip module is electrically connected to an external, electrical interconnection system. The semiconductor substrate has similar thermal properties to the semiconductor chip, this thermal mismatch present between a semiconductor chip and a metallic heatsink in conventional external, electrical interconnection systems is eliminated.

8 Claims, 3 Drawing Sheets

5,473,192

UNITARY SILICON DIE MODULE

BACKGROUND OF THE INVENTION

This invention relates, in general, to semiconductor chips, and more particularly, but not limited to, a semiconductor chip module used in a semiconductor package.

Semiconductor chips or integrated circuits are typically bonded to an external, electrical interconnection system (hereinafter interconnection system). The interconnection system enables one to electrically connect the semiconductor chip to an external system. This interconnection typically includes a metal leads or a leadframe having an integral or a separate metal heatsink. The semiconductor chip is electrically connected to the leads. The chip and a portion of the interconnection system are typically encapsulated or housed in a metal or ceramic housing. The interconnection system, as used herein, also describes chips bonded to a printed circuit board.

In this conventional process, a silicon chip or die with or without metal deposited on the back side is attached to the metal leadframe or a metal heatsink through a die attach or adhesive media. The die attach or adhesive media is comprised of solder or other metallic materials, or an epoxy based material. In this conventional interconnection system, a thermal mismatch occurs between the semiconductor material of the semiconductor chip and the die attach material, and the die attach material and the metallic leadframe. Problems with these interconnection systems include die cracking due to thermal mismatch, failure of the bond between the die and the die attach material, and voiding in conventional solder and epoxy die attach systems.

Thus, it would be desirable to provide an interconnection system without the problems associated with the conventional systems.

SUMMARY OF THE INVENTION

A semiconductor chip module is formed by providing at least one semiconductor chip and a semiconductor substrate and bonding the semiconductor chip to the semiconductor substrate without the use of an epoxy or a metallic layer to create a bond between the semiconductor chip and the semiconductor substrate.

The semiconductor chip may be electrically connected to an external, electrical interconnection system.

DETAILED DESCRIPTION OF THE DRAWINGS

Figure 1:
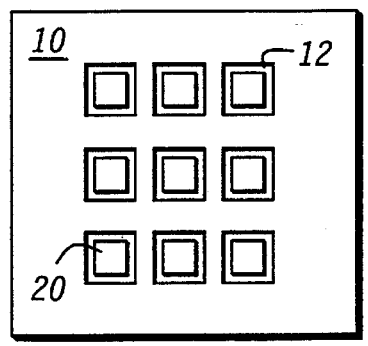
FIG. 1 illustrates a top view of an embodiment of the present invention in a beginning stage of processing.

FIG. 1 illustrates a top view of a beginning process of forming a semiconductor chip module for final assembly into a package. Throughout the description of FIGS. 1–6, it may also be helpful to refer to FIG. 7, which illustrates a flowchart of the present invention. What is shown is a holder or carrier 10 having a plurality of spaced slots 12 in which a plurality of semiconductor chips 20 are placed. This type of holder 10 is typically called a waffle pack, with this one having a stretch grid in which semiconductor chips 20 are spaced apart from each other by a particular distance. Semiconductor chips 20 can be placed into holder 10 by using a pick and place method. The plurality of semiconductor chips 20 are placed front side 21 (shown in FIG. 4) up in holder 10.

Figure 2:
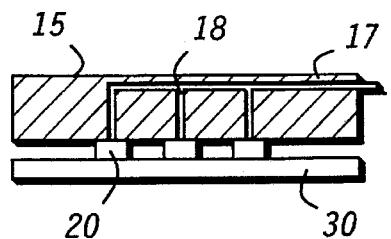
FIG. 2 illustrates a cross-sectional view of an embodiment of the present invention in a further stage of processing.

FIG. 2 illustrates the plurality of semiconductor chips 20 picked up by a vacuum frame 15 from holder 10. Vacuum frame 15 is comprised of a multi-port pick-up surface with a vacuum 17 attached thereto. Vacuum 17 is connected to conduits 18. Before the plurality of semiconductor chips 20 are joined to semiconductor substrate 30, back side 22 (shown in FIG. 4) of the plurality of semiconductor chips 20 must be cleaned. In a preferred embodiment, while the plurality of semiconductor chips 20 are held in place by vacuum pick-up 15 it is submerged in a cleaning solution, preferably an ammonia-hydrogen peroxide solution, for an appropriate amount of time necessary to clean the surface. An example of an appropriate time is 10 minutes.

A semiconductor substrate 30 is then provided. In a preferred embodiment, semiconductor substrate 30 is a wafer of the size which is typically used to form a plurality of semiconductor chips 20 thereon. For example, a 4, 5, 6, or even a 12 inch wafer is used in the art. Also, semiconductor substrate 30 is similarly cleaned. Backside 22 of semiconductor chips 20 are joined to front side 31 (shown in FIG. 4) of semiconductor substrate 30. Once the plurality of semiconductor chips 20 is joined to semiconductor substrate 30, semiconductor substrate 30 and the plurality of semiconductor chips 20 are placed in a horizontal position in a furnace preferably having a temperature of approximately 200° to 400° C. for at least approximately one hour. Bonding may also take place in a vertical position, with a small force applied to semiconductor chips 20 and semiconductor substrate 30. Note that in conventional wafer-to-wafer bonding, rather than chip-to-wafer bonding as done here, a much higher temperature must be used. The temperature range and time chosen is believed to produce an optimum bond between each semiconductor chip 20 and semiconductor substrate 30.

It is important to note that semiconductor chip 20 is bonded to a portion of semiconductor substrate 30 without the use of an adhesive media (epoxy) or a metallic layer. This is important because an adhesive media or metallic layer has a substantially different thermal coefficient of expansion than semiconductor chip 20 or semiconductor substrate 30. In a preferred embodiment, semiconductor substrate 30 is comprised of a semiconductor material which is used to form semiconductor chip 20. Even if semiconductor substrate 30 and semiconductor chip 20 are comprised of dissimilar semiconductor materials, the thermal properties are closer than the thermal properties of a semiconductor material and a metal or an epoxy.

To obtain an optimum bond, preferably, either the front side 31 of semiconductor substrate 30 or backside of semiconductor chip 20 has an oxidized layer chemically formed thereon to minimize or prevent the formation of voids. In a preferred embodiment, this oxidized layer is thermally grown on semiconductor substrate 30 or semiconductor chip 20 by oxidizing the semiconductor material of semiconductor chip 20 or semiconductor substrate 30. If the semiconductor material is comprised of silicon, then preferably the oxidized layer is comprised of silicon dioxide. Note that one element of the oxidized layer is comprised of the semiconductor material. The thickness of the oxidized layer is thin enough that it is negligible in terms of causing problems with semiconductor substrate 30 and semiconductor chip 20 having matched thermal properties. In other words, the oxidized layer does not introduce a significant thermal mismatch to the semiconductor chip module 35 of the present invention. Thus, the present invention avoids the host of failure mechanisms associated with interconnections systems having thermal mismatch.

Figure 3:
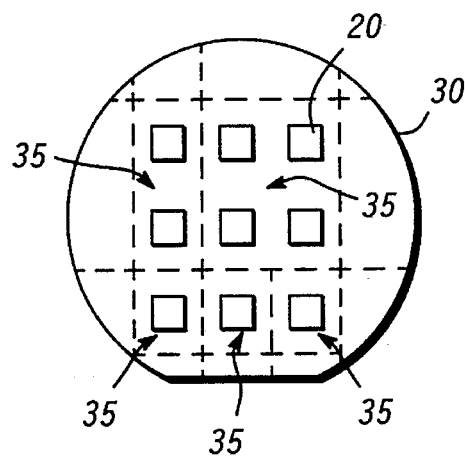
FIG. 3 illustrates a top view of an embodiment of the present invention in a further stage of processing.
Figure 4:
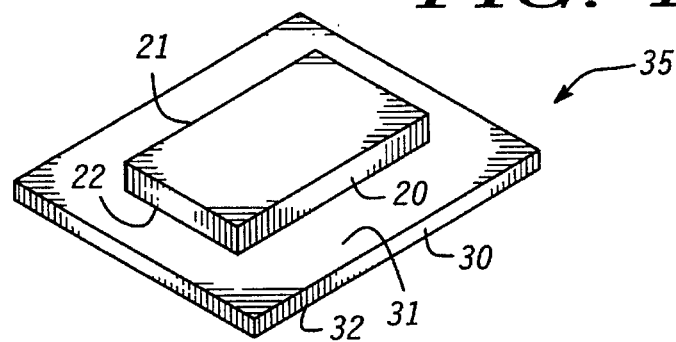
FIG. 4 illustrates a perspective view of an embodiment of the present further along in processing.

FIG. 3 illustrates a top view of semiconductor substrate 30 in the process of singulating at least one semiconductor chip 20 into a module 35 (shown in FIG. 4). Dashed lines 40 indicate where semiconductor substrate 30 may be sawn into a plurality of modules 35. Other methods of singulating semiconductor substrate 30 may be used.

FIG. 4 illustrates a single semiconductor chip module 35 having a front side 31 and a back side 32. In this particular figure, a single semiconductor chip 20 having a front side 21 and a back side 22 is bonded to a portion of semiconductor substrate 30. The portion of semiconductor substrate 30 is larger than semiconductor chip(s) 20 bonded thereon.

Figure 5:
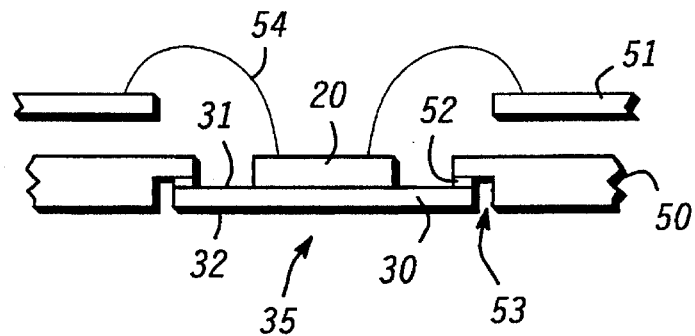
FIG. 5 illustrates a side view of the structure of FIG. 4 further along in process in a first embodiment of the present invention.

FIG. 5 illustrates a semiconductor chip module 35 bonded to an interconnection system 49. Electrical connection 54 is made between leads 51 and semiconductor chip 20. In this embodiment, metal heatsink 50 is separate from leads 51. FIG. 5 illustrates only one way in which semiconductor chip module 35 may be attached to metal heatsink 50. In this embodiment, semiconductor chip module 35 is attached to metal heatsink 50 by attaching front side 31 of semiconductor chip module 35 to metal heatsink 50 by using a thermally conductive bonding material 52, such an electrically conductive or nonconductive epoxy or a solder in this embodiment. In this embodiment, the portion of semiconductor substrate 30 replaces a portion of a conventional metal heatsink. Note that in this embodiment, metal heatsink 50 is provided with an opening so that semiconductor chip 20 is exposed on the front side. Also note that metal heatsink 50 has a step or notch 53 to which semiconductor substrate 30 is bonded to metal heatsink 50. This step 53 is not necessary for all packages, but provides for a coplanar surface when thermally required. This coplanar surface improves the thermal performance characteristics of interconnection system 49. A plastic encapsulant or other housing (not shown) may then be formed to house semiconductor chip module 35, heatsink 50 and a portion of leads 51.

Figure 6:
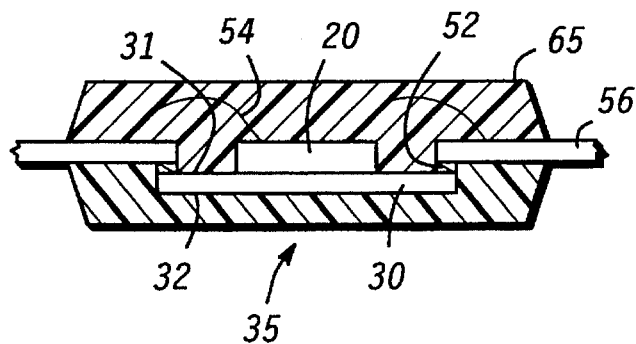
FIG. 6 illustrates a side view of the structure of FIG. 4 further along in process in a second embodiment of the present invention.

FIG. 6 illustrates an interconnection system 60, another embodiment of the present invention. Here, front side 31 of semiconductor chip module 35 can be attached to the leads or leadframe 56 through bonding material 52 as described above with reference to FIG. 5. Electrical connection 54 may be made between leads 56 and semiconductor chip 20 if bonding material 52 is electrically nonconductive. A plastic encapsulant 65 may be formed to encapsulate semiconductor chip module 35 and a portion of leads 56. Many processes are known in the art to accomplish this packaging step. In this embodiment, the portion of semiconductor substrate 30 replaces the metal heatsink of the prior art.

Although there is still thermal mismatch present between semiconductor chip module 35 and metal heatsink 50 (FIG. 5) or leadframe 56 (FIG. 6), the thermal mismatch between the chip 20 and the material adjacent chip 20 is removed. Also, area in which there is thermal mismatch is smaller than in the prior art because only a portion of semiconductor substrate 30 is bonded to the metal heatsink or leads. In the prior art, the material adjacent the chip was a solder or epoxy layer and then the metal heatsink adjacent to that. By removing the thermal mismatch between the chip and the solder or epoxy and the solder or epoxy and the metal heatsink in the present invention, the thermal properties of the interconnection system are improved over conventional interconnection systems. In both embodiments shown above, a metal heatsink is not adjacent back side 22 of semiconductor chip 20. Thus the thermal mismatch present between the semiconductor chip and the metal heatsink in the prior art is not present in this invention. Consequently, cracking of semiconductor chip 20 is avoided in the present invention.

Figure 7:
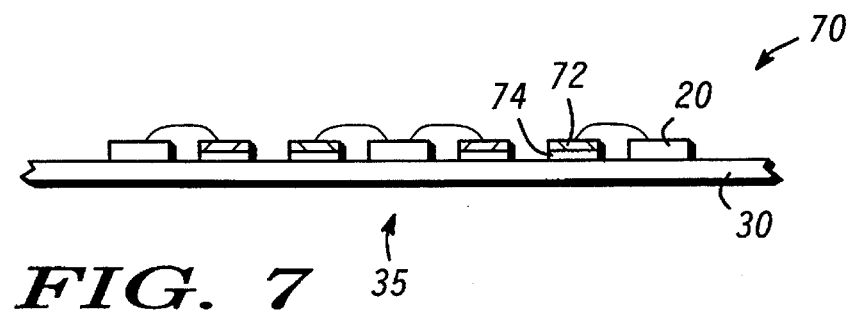
FIG. 7 illustrates a side view of the structure of FIG. 4 further along in process in a third embodiment of the present invention.

FIG. 7 illustrates yet another embodiment of the present invention. In this embodiment, semiconductor chip module 35 is used to replace all or a portion of a board in a printed circuit board. Electrically isolated metal layers or stripes 72 (which act as leads) can be formed directly on a portion of substrate 30. Metal layer 72 are electrically isolated from each other and the portion of semiconductor substrate 30. One way of forming isolated metal layers 72 is by forming an insulating layer on front side 31 of semiconductor substrate 30 and subsequently forming a metal layer (through evaporation or sputtering) on the insulating layer. The metal layer and insulating layer are then patterned to form a plurality of isolated metal layers 72 and an insulating portion (or a plurality of insulating portions) 74. Other methods may be used to form electrically isolated metal layers 72. These metal layers 72 are then electrically connected to semiconductor chip 20 by electrical connectors 54. Note that the three embodiments described herein all show different external, electrical interconnection systems in which semiconductor chip module 35 of the present invention can be electrically connected to.

Figure 8:
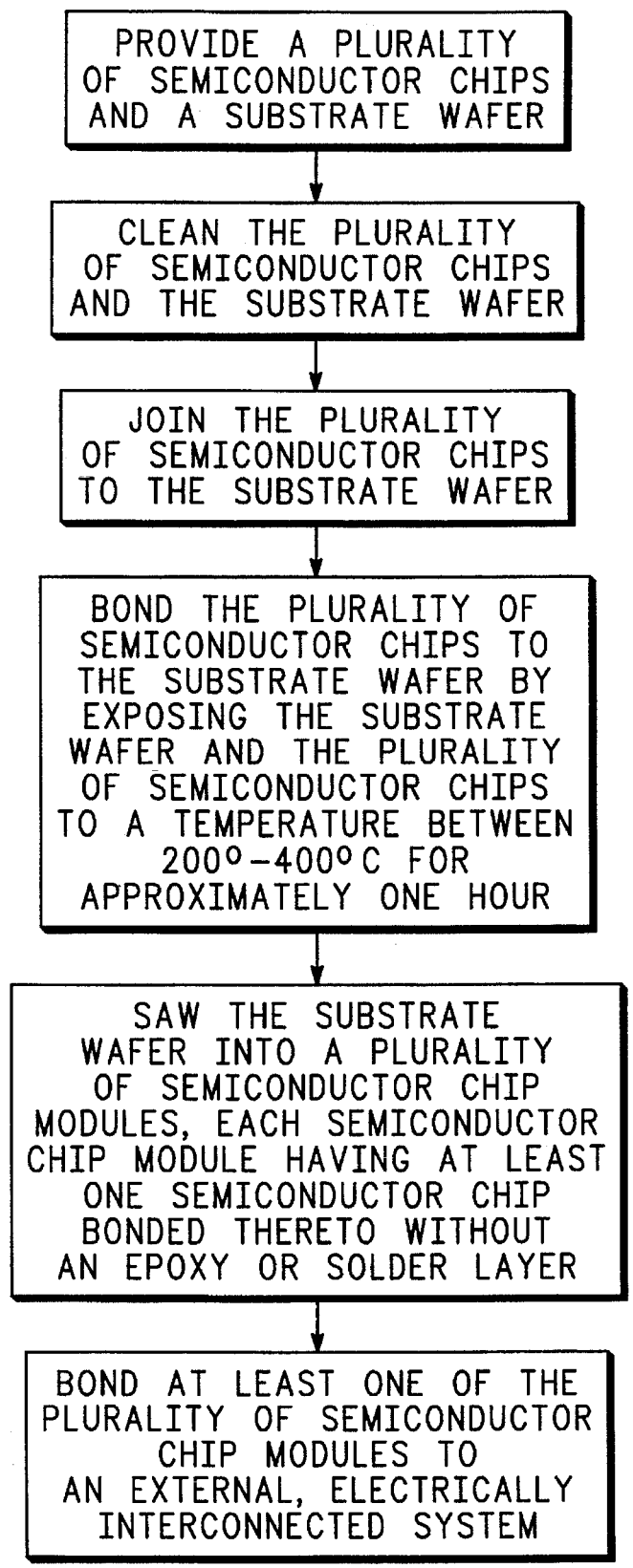
FIG. 8 illustrates a flow chart of an embodiment of a process flow of the present invention.

FIG. 8 illustrates a flow chart of the process used in the present invention to fabricate a semiconductor chip module. By using the semiconductor chip module of the present invention, the die does not have to be bonded directly to a metallic heatsink through an adhesive media thus thermal mismatch is prevented. Thermal mismatch leads to high stresses in the adhesive media and has been known to cause die cracking. Also, the thermal performance of the interconnection system is enhanced by the elimination of thermal mismatch.

We claim:

1. A semiconductor chip module, comprising:
at least one semiconductor chip having a front side and a back side;
a semiconductor substrate comprised of a semiconductor material that comprises the at least one semiconductor chip having a front side and a back side, wherein the semiconductor substrate is larger than the at least one semiconductor chip and the back side of the at least one semiconductor chip is bonded to the front side of the semiconductor substrate without the use of an epoxy or a metallic layer to create the bond between the at least one semiconductor chip and the semiconductor substrate; and a metal heatsink having a front side and a back side and coupled to the front side of the semiconductor substrate, the back side of the metal heatsink being coplanar with the back side of the semiconductor substrate.

2. The semiconductor chip module of claim 1 wherein the semiconductor substrate is comprised of a semiconductor material and an oxidized layer chemically formed on the semiconductor substrate, wherein the at least one semiconductor chip is directly bonded to the oxidized layer.

3. The semiconductor chip module of claim 1 wherein the semiconductor chip is comprised of an oxidized layer chemically formed on the backside of the at least one semiconductor chip, wherein the semiconductor substrate is directly bonded to the oxidized layer.

4. The semiconductor chip module of claim 1 wherein the semiconductor substrate is comprised of silicon and a silicon dioxide layer chemically formed on the silicon, wherein the at least one semiconductor chip is directly bonded to the silicon dioxide layer and the thickness of the silicon dioxide layer is of a thickness that does not substantially affect the thermal properties of the semiconductor chip module.

5. The semiconductor chip module of claim 1 further comprising an external, electrical interconnection system electrically connected to the at least one semiconductor chip.

6. A semiconductor chip package, comprised of:

a semiconductor chip module comprised of a semiconductor chip and a semiconductor substrate bonded to the semiconductor chip, without the use of an epoxy or a metallic layer; and an external, electrical interconnection system comprised of a lead, wherein the lead is electrically connected to the semiconductor chip and is electrically coupled to a portion of the semiconductor substrate through an epoxy or solder layer.

7. The semiconductor chip module of claim 1 further comprising a lead electrically coupled to the semiconductor substrate by an epoxy or solder material.

8. The semiconductor chip module of claim 1 wherein the metal heatsink is coupled to the semiconductor substrate by a thermally conductive bonding material.

* * * * *